(12) United States Patent
Ku

(10) Patent No.: US 8,243,533 B2
(45) Date of Patent: Aug. 14, 2012

(54) SEMICONDUCTOR MEMORY DEVICE AND METHOD OF OPERATING THE SAME

(75) Inventor: Kie-Bong Ku, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 268 days.

(21) Appl. No.: 12/648,579

(22) Filed: Dec. 29, 2009

(65) Prior Publication Data

US 2011/0080794 A1   Apr. 7, 2011

(30) Foreign Application Priority Data

Oct. 6, 2009   (KR) ........................ 10-2009-0094593

(51) Int. Cl.
*G11C 7/10* (2006.01)
*G11C 7/00* (2006.01)
(52) U.S. Cl. ............. 365/189.17; 365/191; 365/189.011
(58) Field of Classification Search .................. None
See application file for complete search history.

(56) References Cited

U.S. PATENT DOCUMENTS

2002/0161981 A1* 10/2002 Tsuchida et al. ............. 711/169

FOREIGN PATENT DOCUMENTS

| JP | 2002-056676 | 2/2002 |
|---|---|---|
| KR | 1020020013785 | 2/2002 |

OTHER PUBLICATIONS

Notice of Preliminary Rejection issued from Korean Intellectual Property Office on Jan. 7, 2011.
Notice of Allowance issued from Korean Intellectual Property Office on May 31, 2011.

* cited by examiner

*Primary Examiner* — Hoai V Ho
*Assistant Examiner* — James G Norman
(74) *Attorney, Agent, or Firm* — IP & T Group LLP

(57) ABSTRACT

A semiconductor memory device allows a read command to be inputted thereto after a passage of a relatively short time period from a point in time where a write command has been inputted thereto. A method of operating the semiconductor memory device includes inputting a write command, inputting a read command in a preset period of time after the write command has been inputted, loading read data of a memory cell onto a data bus in response to the read command; and loading write data from outside of the semiconductor memory device onto the data bus in response to the write command.

13 Claims, 4 Drawing Sheets

SEMICONDUCTOR MEMORY DEVICE AND METHOD OF OPERATING THE SAME

CROSS-REFERENCE TO RELATED APPLICATIONS

The present application claims priority of Korean Patent Application No. 10-2009-0094593, filed on Oct. 6, 2009, which is incorporated herein by reference in its entirety.

BACKGROUND OF THE INVENTION

Exemplary embodiments of the present invention relate to a semiconductor memory device and an operating method thereof, and more particularly, to technology for reducing a write to read command time interval (tWTR_CMD) between a write command and a read command of a semiconductor memory device.

FIG. 1 is a timing diagram illustrating the operation of a conventional memory device upon receiving a write command WRITE and a read command READ in succession.

In the following exemplary description, the additive latency (AL) has been set to 0, the column address strobe (CAS) write latency (CWL) has been set to 9, the CAS latency (CL) has been set to 13, and a burst length (BL) has been set to 4. The AL represents additive latency for a post-CAS operation; the CWL is obtained by subtracting the AL from the write latency (WL), the WL being the latency from the input of the write command WRITE to the input of corresponding write data from outside of the memory device; the CL represents the latency from the input of the read command READ to the output of corresponding data from the memory device; and the BL represents the number of data units outputted in series.

First of all, the write command WRITE is inputted to the memory device. Then, after the passage of 9 clocks corresponding to the WL, write data are inputted through a DQ pad from outside of the memory device. Since the BL is set to 4, 4 units of data are continuously inputted through the DQ pad during 2 clocks. The write data inputted through the DQ pad are arranged and then transmitted to a memory cell region through a data bus DATA BUS and are stored in the memory cell region. In FIG. 1, the write data loaded onto the data bus DATA BUS are represented by iDATA WT.

After the write data are inputted through the DQ pad and after the passage of the tWTR, the read command READ is inputted, the tWTR being defined as a time period from the input of the write data to the input of the read command READ. Then, the data stored in the memory cell region are read out and the read data are transferred to the DQ pad through the data bus DATA BUS. In FIG. 1, the read data loaded onto the data bus DATA BUS are represented by iDATA RD. The read data transferred to the DQ pad are arranged and then outputted outside of the memory device depending on the CL.

If the memory device operates as described above, the read command READ should be inputted after the passage of at least 16 clocks from a point in time where the write command WRITE has been inputted. If the read command READ is inputted before the passage of 16 clocks from the point in time where the write command WRITE has been inputted as the tWTR becomes shorter, a collision may occur on the data bus DATA BUS between the read data iDATA RD and the write data iDATA WT and thus, the data may vanish.

In the conventional semiconductor memory device, the read command READ should be inputted after the passage of a long time period from the point in time where the write command WRITE has been inputted. As a result, the performance of the semiconductor memory device is deteriorated.

SUMMARY OF THE INVENTION

An embodiment of the present invention is directed to a semiconductor memory device capable of improving its performance by allowing a read command to be inputted thereto after the passage of a relatively short time period from a point in time where a write command has been inputted thereto.

In accordance with an embodiment of the present invention, a method of operating a semiconductor memory device includes: inputting a write command; inputting a read command in a preset period of time after the write command has been inputted; loading read data of a memory cell onto a data bus in response to the read command; and loading write data from outside of the semiconductor memory device onto the data bus in response to the write command.

The preset period of time is in a range from a point in time of a minimum column address strobe (CAS) to CAS delay (tCCD_min) to a point in time obtained by subtracting the tCCD_min from a CAS write latency.

In accordance with another embodiment of the present invention, a method of operating a semiconductor memory device includes: receiving a write command; receiving a read command before data corresponding to the write command has been inputted from outside of the semiconductor memory device; loading data read out of a memory cell onto a data bus in response to the read command; and loading data inputted from outside of the semiconductor memory device onto the data bus in response to the write command.

The data read out of the memory cell in response to the read command may be loaded onto the data bus prior to the data being inputted from outside of the semiconductor memory device in response to the write command.

In accordance with yet another embodiment of the present invention, a semiconductor memory device includes: a data input/output pad block; a memory cell block; and a data bus configured to transfer data between the data input/output pad block and the memory cell block, wherein, upon a read command being inputted in a preset period of time after a write command has been inputted, data read out of the memory cell block in response to the read command is loaded onto the data bus prior to data being inputted to the data input/output pad block in response to the write command.

The preset period of time is in a range from a point in time of a minimum column address strobe (CAS) to CAS delay (tCCD_min) to a point in time obtained by subtracting the tCCD_min from a CAS write latency.

DESCRIPTION OF SPECIFIC EMBODIMENTS

Figure 1:
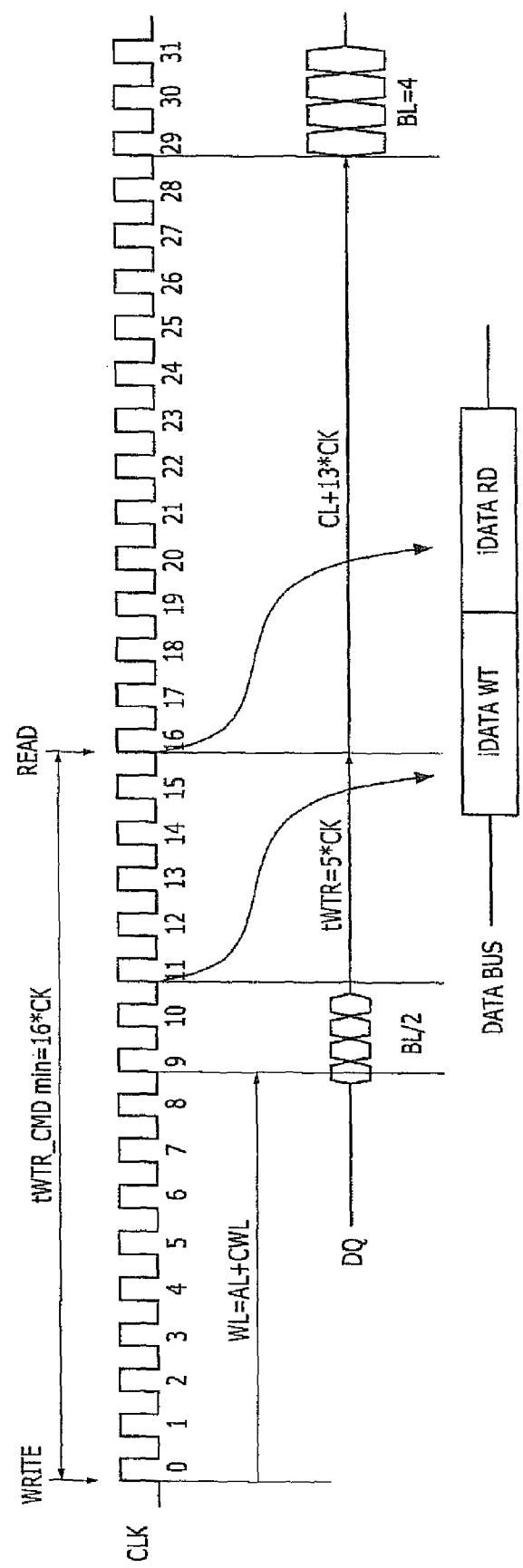
FIG. 1 is a timing diagram illustrating the operation of a conventional memory device upon receiving a write command and a read command in succession.

Exemplary embodiments of the present invention are described below in more detail with reference to the accompanying drawings. The present invention may, however, be embodied in different forms and should not be constructed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Referring to the operation of the conventional semiconductor memory device of FIG. 1, the data bus DATA BUS remains empty for a long period of time after the write command WRITE has been inputted. However, in accordance with embodiments of the present invention, upon the read command READ being inputted right after the write command WRITE has been inputted, the read data are first transferred through the empty data bus DATA BUS and then the write data are transferred through the data bus DATA BUS.

That is, if the read command READ is inputted in a preset period of time after the write command WRITE has been inputted, the read data are first loaded onto the data bus DATA BUS and then the write data are loaded onto the data bus DATA BUS. The order that the commands WRITE and READ are inputted and the order that the read and write data are loaded onto the data bus DATA BUS are reversed and this enhances the effectiveness of the usage of the data bus DATA BUS.

In the following embodiments of the present invention, a time period between the write command WRITE and the read command READ to perform operations introduced by the embodiments of the present invention is defined as a range from tCCD_min (a minimum CAS to CAS delay) to CWL-tCCD_min. Of course, a size of the time period may be changed depending on parameters and the design of the semiconductor memory device.

Figure 2:
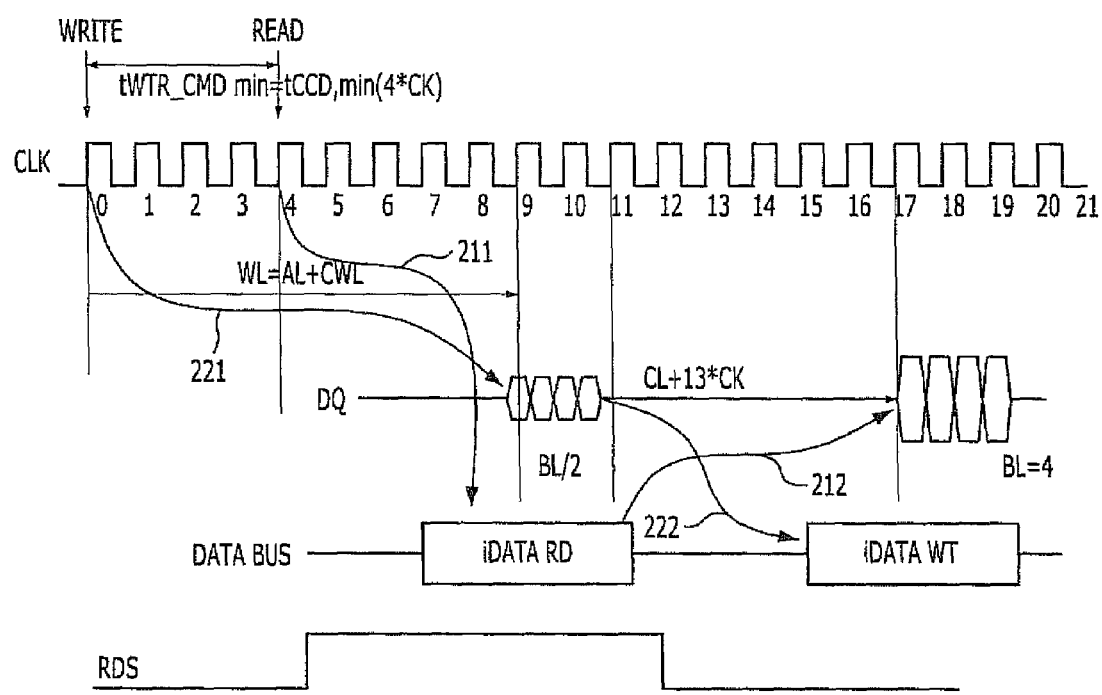
FIG. 2 is a timing diagram illustrating the operation of a semiconductor memory device in accordance with an embodiment of the present invention, upon a time period between a write command and a read command being equal to the passage of 4 clocks.

FIG. 2 is a timing diagram illustrating the operation of a semiconductor memory device in accordance with an embodiment of the present invention. As shown in FIG. 2, a read command READ is inputted within the shortest time period after a write command WRITE has been inputted. That is, the time period between the write command WRITE and the read command READ is tCCD_min. In FIG. 2, the additive latency (AL) is set to 0; the CAS write latency (CWL) is set to 9; the CAS latency (CL) is set to 13; and a burst length is set to 4. As described above, the AL represents additive latency for a post-CAS operation; the CWL is obtained by subtracting the AL from the write latency (WL), the WL being the latency from the input of the write command WRITE to the input of corresponding write data from outside of the memory device; the CL represents the latency from the input of the read command READ to the output of corresponding data from the memory device; and the BL represents the number of data units outputted in series.

Referring to FIG. 2, the write command WRITE is first inputted and then the read command READ is inputted after the passage of tCCD_min (4*tCK). Data iDATA RD stored in a memory cell region of the memory device are read out and loaded onto a data bus DATA BUS in response to the input of the read command READ. Then, after the write command WRITE has been inputted and upon the passage of a time period corresponding to the write latency (WL), data are inputted to a data pad DQ from outside of the memory device. The data iDATA WT inputted from outside of the memory device are arranged through a sequence of arranging processes and then transferred to the memory cell region through the data bus DATA BUS. The arranging process is a process where the data iDATA WT serially inputted to the data pad DQ from outside of the memory device are converted to parallel data before they are loaded onto the data bus DATA BUS. Meanwhile, the read data iDATA RD loaded onto the data bus DATA BUS start to be outputted to the data pad DQ after the passage of the CAS latency (CL) from a point in time where the read command READ has been inputted. Of course, the read data iDATA RD transferred to the data pad DQ through the data bus DATA BUS go through a parallel-to-serial conversion process.

FIG. 2 represents processes where read and write operations are performed using arrows. The arrows 211 and 212 starting from the read command READ represent operations relating to the read operation and the arrows 221 and 222 starting from the write command WRITE represent operations relating to the write operation.

In the conventional memory device of FIG. 1, the input of the read command READ is allowed after the write command WRITE has been inputted and then the write data are inputted to the memory device. Thus, since data are always loaded on the data bus DATA BUS in the order as corresponding commands are inputted, the data bus DATA BUS may remain empty for a long period of time. However, in accordance with the embodiments of the present invention, after the write command WRITE has been inputted and even before the write data are inputted to the memory device, the input of the read command READ is allowed. In that case, data corresponding to the read command READ are first loaded onto the data bus DATA BUS. Therefore, the data bus DATA BUS can be more effectively utilized. Referring to FIG. 2, note that it takes 19 clocks from a point in time where the write command WRITE has been inputted to a point in time where both the write operation and the read operation have been completed. This is in contrast with the case where 30 clocks are needed to perform the same operations in the conventional memory device of FIG. 1.

As illustrated in FIG. 2, the data outputted from the data pad DQ are greater than the data inputted to the data pad DQ. In general, since the drivability of the output data is better than that of the input data, the difference in sizes of the data on the data pad DQ represents the drivability difference.

An RDS signal in FIG. 2 represents a signal for determining a direction of data transmitted through the data bus DATA BUS. Thus, while the RDS signal is set at a logic high level, the data bus DATA BUS transfers the data in a direction from the memory cell region to the data pad DQ, wherein a read direction is activated. On the other hand, while the RDS signal is set to a logic low level, the data bus DATA BUS transfers the data in a direction from the data pad DQ to the memory cell region, wherein a write direction is activated.

Figure 3:
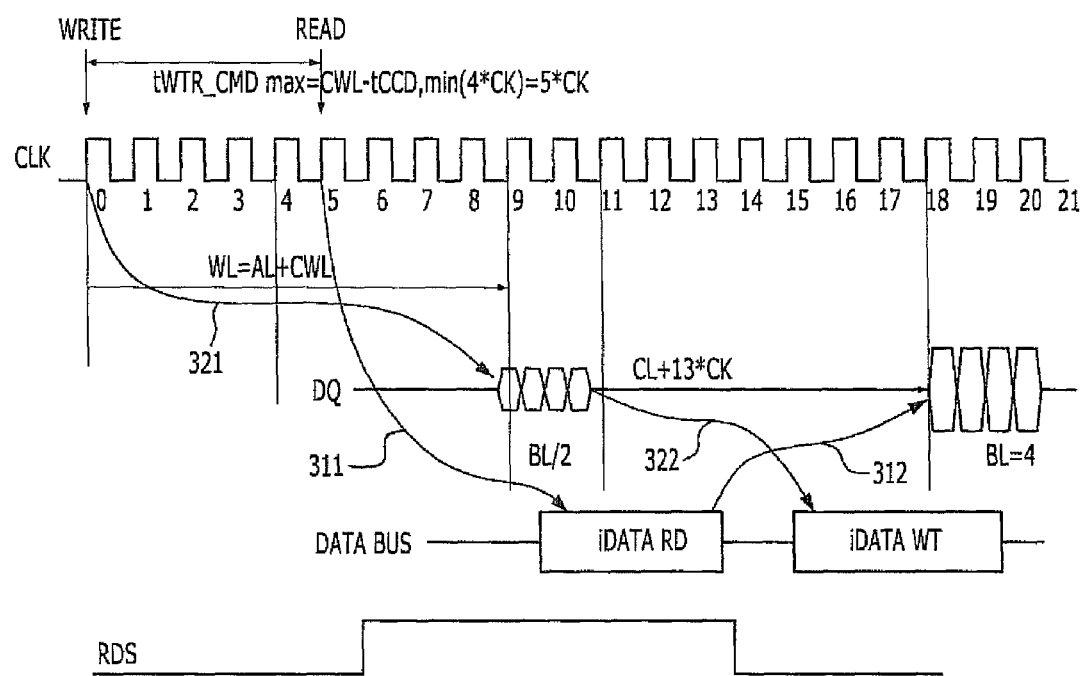
FIG. 3 is a timing diagram illustrating the operation of a semiconductor memory device in accordance with an embodiment of the present invention, upon a time period between a write command and a read command being equal to the passage of 5 clocks.

FIG. 3 is a timing diagram illustrating the operation of a semiconductor memory device in accordance with another embodiment of the present invention. FIG. 3 shows that the order where the commands WRITE and READ are inputted and the order where the corresponding read and write data are loaded on the data bus DATA BUS are reversed in accordance with an embodiment of the present invention. It shows the case where the read command READ is inputted after the write command WRITE has been inputted. That is, the time period between the write command WRITE and the read command READ becomes CWL-tCCD_min. Furthermore, in FIG. 3, the AL is set to 0; the CWL is set to 9; the CL is set to 13; and the BL is set to 4.

Referring to FIG. 3, the write command WRITE is first inputted and the read command READ is then inputted after the passage of 5 clocks (CWL-tCCD_min). The data iDATA RD stored in the memory cell region of the memory device are read out in response to the input of the read command READ and the read data iDATA RD are loaded onto the data bus DATA BUS. After the write command WRITE has been inputted and the passage of a time period corresponding to the WL, data are inputted to the data pad DQ from outside of the memory device. The data iDATA WT inputted from outside of the memory device are arranged through a sequence of arranging processes and then transmitted to the memory cell region through the data bus DATA BUS. The arranging process is a process where the data iDATA WT serially inputted to the data pad DQ from outside of the memory device are converted to parallel data before they are loaded onto the data bus DATA BUS. In the meantime, the read data iDATA RD loaded onto the data bus DATA BUS start to be outputted to the data pad DQ after the passage of the CL from a point in time where the read command READ has been inputted. Of course, the read data iDATA RD transmitted to the data pad DQ through the data bus DATA BUS go through a parallel-to-serial conversion process.

FIG. 3 represents processes where read and write operations are performed using arrows. The arrows 311 and 312 starting from the read command READ represent operations relating to the read operation and the arrows 321 and 322 starting from the write command WRITE represent operations relating to the write operation.

Referring to FIG. 3, although the read command READ is inputted to the memory device after the write command WRITE has been inputted, the read data iDATA RD is loaded onto the data bus DATA BUS prior to the write data iDATA WT. Therefore, the data bus DATA BUS is more effectively used. Referring to FIG. 3, note the passage of 20 clocks from a point in time where the write command WRITE is inputted to a point in time where both the write operation and the read operation have been completed. This contrasts with the passage of 30 clocks needed to perform the same operations in the conventional memory device of FIG. 1.

Likewise in FIG. 2, referring to FIG. 3, the data outputted from the data pad DQ are greater than the data inputted to the data pad DQ. Furthermore, an RDS signal shown in FIG. 3 represents a signal for determining a direction of data transmitted through the data bus DATA BUS as in FIG. 2. Thus, while the RDS signal is set to a logic high level, the data bus DATA BUS transfers the data in a direction from the memory cell region to the data pad DQ, wherein the read direction is activated. On the other hand, while the RDS signal is set to a logic low level, the data bus DATA BUS transfers the data in a direction from the data pad DQ to the memory cell region, wherein the write direction is activated.

Figure 4:
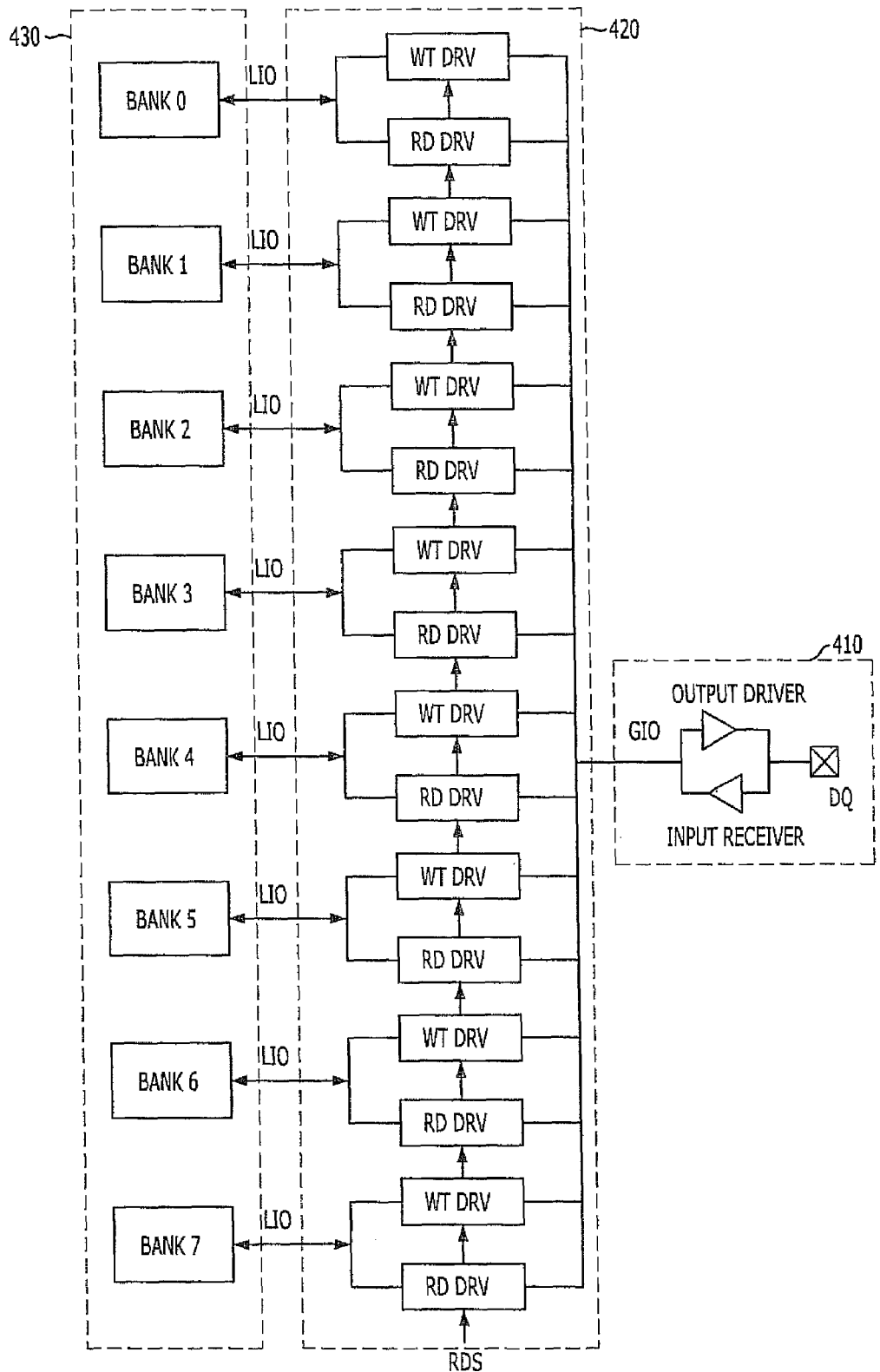
FIG. 4 illustrates a block diagram of a semiconductor memory device in accordance with an embodiment of the present invention.

FIG. 4 is a block diagram of a semiconductor memory device in accordance with an embodiment of the present invention.

Referring to FIG. 4, the semiconductor memory device includes a data input/output pad region 410, a memory cell region 430, and a data bus 420 disposed between the data input/output pad region 410 and the memory cell region 430 to transfer data. As described in FIGS. 2 and 3, if the read command READ is inputted within a preset period of time after the write command WRITE has been inputted to the memory device, data read out of the memory cell region 430 in response to the read command READ are loaded onto the data bus 420 prior to data being inputted to the data input/output pad region 410 in response to the write command WRITE.

The memory cell region 430 includes a plurality of banks BANK 0 to BANK 7 and each of the banks BANK 0 to BANK 7 has a multiplicity of unit memory cells. In a read operation, data stored in the memory cell region 430 are transferred to the data input/output pad region 410 through the data bus 420 and then outputted to the outside of the memory device. In a write operation, data inputted to the data input/output pad region 410 are transferred to the memory cell region 430 through the data bus 420 and then stored in the unit memory cells.

The data input/output pad region 410 includes a plurality of data input/output pads DQ and an output driver and an input receiver prepared for each data input/output pad DQ. FIG. 4 shows only one input/output pad DQ. The data input/output pad region 410 plays a role of performing the input/output of data between the memory device and outside of the memory device.

The data bus 420 includes a plurality of global input/output lines GIO, a plurality of local input/output lines LIO, a plurality of write drivers WT DRV, and a plurality of read drivers RD DRV, and plays a role of transmitting data between the memory cell region 430 and the data input/output pad region 410. While the RDS signal is enabled, the read driver RD DRV is activated and thus data are transferred from the memory cell region 430 to the data input/output pad region 410. While the RDS signal is disabled, the write driver WT DRV is activated and thus data are transferred from the data input/output pad region 410 to the memory cell region 430.

The RDS signal may be generated in a command decoder (not shown) that decodes commands inputted from outside of the memory device. The RDS signal is enabled in response to the read command READ and disabled during the passage of a period of time where the read data iDATA RD move though the data bus DATA BUS.

In accordance with the embodiment of the present invention, if the read command READ is inputted in a preset period of time after the write command WRITE has been inputted, the read data iDATA RD are first processed in the memory device. Thus, a case occurs in which addresses corresponding to the read operation should be decoded prior to addresses corresponding to the write operation. This problem can be solved by employing an address decoder (not shown) corresponding to the read operation and a separate address decoder corresponding to the write operation.

Moreover, it is possible to design the memory device in accordance with an embodiment of the present inventive only with an address decoder by restricting the access to the same bank when the write command WRITE is inputted and then the read command READ is continuously inputted. In addition, when restricting the continuous access to the same bank, it is possible to set a point in time where the read command READ is inputted earlier after a point in time where the write command WRITE is inputted. For instance, although tCCD_min is set to 4 clocks in FIGS. 2 and 3, tCCD_min may be set to 2 clocks when restricting the continuous access to the same bank, i.e., when the write and read operations are allowed to be performed in different banks.

Furthermore, the data bus 420 may be designed to include a path through which the read data iDATA RD move and a separate path through which the write data iDATA WT move. In such a case, since the collision between the read data iDATA RD and the write data iDATA WT may be minimized, it is possible to further reduce tCCD_min.

In accordance with the embodiments of the present invention, the read data are loaded on the data bus prior to the write data when the read command has been inputted in a preset period of time after the write command has been inputted. That is, it is possible to more effectively utilize the data bus by loading the read data onto the data bus before the write data are loaded onto the data bus, since it takes a long time for the write data to be loaded onto the data bus after the write command has been inputted.

Therefore, it is possible to allow the input of the read command to the memory device just after the write command has been inputted. As a result, the period of time tWTR_CMD between the write command and the read command may be reduced, which is a major performance parameter of the memory device.

While the present invention has been described with respect to the specific embodiments, it will be apparent to those skilled in the art that various changes and modifications may be made without departing from the spirit and scope of the present invention as defined by the following claims.

What is claimed is:

1. A method of operating a semiconductor memory device, the method comprising:
receiving a write command;
receiving a read command;
determining whether the read command is received in a preset period of time after the write command has been received;
loading read data of a memory cell onto a data bus before loading write data from outside of the semiconductor memory device onto the data bus when the read command is determined to be received in the preset of time; and
loading the write data from outside of the semiconductor memory device onto the data bus before loading the read data onto the data bus when the read command is determined to be received after the preset period of time.

2. The method of claim 1, wherein the preset period of time is in a range from a point in time of a minimum column address strobe (CAS) to CAS delay (tCCD_min) to a point in time obtained by subtracting the tCCD_min from a CAS write latency.

3. The method of claim 1, wherein the read data is outputted outside of the semiconductor memory device after the read command has been inputted and after a passage of time corresponding to a column address strobe latency.

4. The method of claim 1, wherein the write data is inputted from outside of the semiconductor memory device to be loaded onto the data bus after the write command has been inputted and after a passage of time corresponding to a column address strobe write latency.

5. A semiconductor memory device, comprising:
a data input/output pad block;
a memory cell block; and
a data bus configured to transfer data between the data input/output pad block and the memory cell block,
wherein, when a read command is being inputted in a preset period of time after a write command has been inputted, read data read out of the memory cell block in response to the read command is loaded onto the data bus prior to loading write data onto the data input/output pad block in response to the write command, and
when the read command is being inputted after the preset period of time after the write command has been inputted, the write data is loaded onto the data input/output pad block prior to loading the read data onto the data bus in response to the read command.

6. The semiconductor memory device of claim 5, wherein the read command is inputted to the semiconductor memory device ahead of the write data by a time required for the data bus to transfer, when the read command is being inputted in the preset of time, the read data in response to the read command.

7. The semiconductor memory device of claim 5, wherein the preset period of time is in a range from a point in time of a minimum column address strobe (CAS) to CAS delay (tCCD_min) to a point in time obtained by subtracting the tCCD_min from a CAS write latency.

8. The semiconductor memory device of claim 5, wherein the data bus comprises a plurality of global input/output lines and a plurality of local input/output lines.

9. The semiconductor memory device of claim 5, wherein the data bus comprises a path through which the read data moves and a path through which the write data moves, the paths being separated from each other.

10. The semiconductor memory device of claim 5, wherein the data bus comprises a plurality of read and write drivers configured to transmit respective read and write data between the data input/output pad block and the memory cell block in response to a control signal.

11. The semiconductor memory device of claim 10, wherein the read driver is activated to transmit the read data from the memory cell block to the data input/output pad block in response to the enabled control signal, and the write driver is activated to transmit the write data from the data input/output pad block to the memory cell block in response to the disabled control signal.

12. The semiconductor memory device of claim 11, wherein the control signal is enabled when the read command is being inputted to the semiconductor memory device ahead of the write data by a time required for the data bus to transfer the read data in response to the read command.

13. The semiconductor memory device of claim 12, wherein the control signal is enabled for the time required for the data bus to transfer the read data in response to the read command.

* * * * *